(12) United States Patent
Yumoto et al.

(10) Patent No.: US 12,356,554 B2
(45) Date of Patent: Jul. 8, 2025

(54) METHOD FOR MANUFACTURING BONDED BODY AND METHOD FOR MANUFACTURING INSULATION CIRCUIT SUBSTRATE

(71) Applicant: MITSUBISHI MATERIALS CORPORATION, Tokyo (JP)

(72) Inventors: Ryohei Yumoto, Saitama (JP); Takeshi Kitahara, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 301 days.

(21) Appl. No.: 17/912,159

(22) PCT Filed: Mar. 22, 2021

(86) PCT No.: PCT/JP2021/011704
§ 371 (c)(1),
(2) Date: Sep. 16, 2022

(87) PCT Pub. No.: WO2021/193528
PCT Pub. Date: Sep. 30, 2021

(65) Prior Publication Data
US 2023/0115820 A1  Apr. 13, 2023

(30) Foreign Application Priority Data
Mar. 24, 2020  (JP) ................. 2020-052827

(51) Int. Cl.
*H05K 3/02* (2006.01)
*C04B 37/02* (2006.01)
(Continued)

(52) U.S. Cl.
CPC ............ *H05K 3/022* (2013.01); *C04B 37/02* (2013.01); *H01L 23/3735* (2013.01); *H05K 1/05* (2013.01);
(Continued)

(58) Field of Classification Search
CPC ............ H05K 3/022; H05K 1/05; H05K 1/09; H05K 2201/0335; H05K 2201/0379; H05K 2203/068; C04B 37/02; H01L 23/3735
See application file for complete search history.

(56) References Cited

U.S. PATENT DOCUMENTS

| | | |
|---|---|---|
| 2015/0366048 A1 | 12/2015 | Nagase et al. |
| 2020/0009671 A1 | 1/2020 | Yumoto et al. |
| 2021/0028086 A1 | 1/2021 | Yumoto et al. |

FOREIGN PATENT DOCUMENTS

| | | |
|---|---|---|
| JP | 2015-130431 A | 7/2015 |
| JP | 2016-063145 A | 4/2016 |

(Continued)

OTHER PUBLICATIONS

Machine translation of JP2015130431 A (Year: 2015).*
(Continued)

*Primary Examiner* — Vishal I Patel
(74) *Attorney, Agent, or Firm* — Troutman Pepper Locke LLP; James E. Armstrong, IV; Nicholas J. DiCeglie, Jr.

(57) ABSTRACT

When a laminate of a plurality of different materials including a metal plate is bonded in a pressurized and heated state, a first pressurizing member in which a first metal foil/a carbon sheet or a ceramic sheet/a graphite sheet are laminated in this order is arranged so that the first metal foil is in contact with a surface of the first metal plate of the laminate, the first metal foil is made of a material that does not react at a contact surface of the first plate member and the first metal foil when heating, and a product of a Young's modulus (GPa) and a thickness (mm) of the first metal foil is 0.6 or more and 100 or less, so that a good bonded body can be manufactured by evenly pressurizing the laminate and foreign substances can be restrained from adhering to the surface of the laminate.

4 Claims, 4 Drawing Sheets

(51) Int. Cl.
*H01L 23/373* (2006.01)
*H05K 1/05* (2006.01)
*H05K 1/09* (2006.01)

(52) U.S. Cl.
CPC ....... *H05K 1/09* (2013.01); *H05K 2201/0335* (2013.01); *H05K 2201/0379* (2013.01); *H05K 2203/068* (2013.01)

(56) References Cited

FOREIGN PATENT DOCUMENTS

| | | |
|---|---|---|
| JP | 2016-072563 A | 5/2016 |
| WO | 2019188885 A1 | 10/2019 |

OTHER PUBLICATIONS

Machine translation of JP2016063145 A (Year: 2016).*
Supplementary European Search Report mailed Apr. 9, 2024, issued for European Patent Application No. 21775305.2.

* cited by examiner

METHOD FOR MANUFACTURING BONDED BODY AND METHOD FOR MANUFACTURING INSULATION CIRCUIT SUBSTRATE

BACKGROUND OF THE INVENTION

Technical Field

The present invention relates to a method for manufacturing a bonded body composed of a plurality of different metal plates, such as a power module substrate having a two-layer structure of a circuit layer, and particularly to a manufacturing method suitable for bonding metal plates by solid-phase diffusion bonding, and a method of manufacturing an insulation circuit substrate using the method of manufacturing the bonded body. Priority is claimed on Japanese Patent Application No. 2020-052827, filed Mar. 24, 2020, the content of which is incorporated herein by reference.

Background Art

For a power module substrate (insulation circuit substrate), generally, a circuit layer is formed on one surface of a ceramic substrate serving as an insulation layer and a heat dissipation layer is formed on the other surface.

As the power module substrate, a power module substrate in Patent Literature 1 is disclosed, for example. In this power module substrate, by bonding metal plates made of aluminum or aluminum alloy, or copper or copper alloy on both surfaces of a ceramic substrate via brazing material, a circuit layer is formed on one surface of the ceramic substrate and a heat dissipation layer is formed on the other surface. On the heat dissipation layer, a heat dissipation plate made of aluminum or aluminum alloy or copper or copper alloy is bonded.

The ceramic substrate and the metal plate in this power module substrate are bonded by pressurizing and heating the laminate of them by a pressurizing device. At this time, between the laminate and the pressurizing device, a spacer formed by laminating a carbon layer and a graphite layer is interposed therein. In this case, the carbon layer is disposed on the laminate side.

CITATION LIST

[Patent Literature 1] Japanese Unexamined Patent Application, First Publication No. 2016-63145

SUMMARY OF INVENTION

Technical Problem

As a power module substrate of this type, the circuit layer may have a two-layer structure of aluminum and copper. For manufacturing a bonded body made of a plurality of different metal plates as described above, a copper layer is formed by bonding a copper plate on an aluminum layer formed on a ceramic substrate by the method described in Patent Literature 1; for bonding aluminum and copper, solid-phase diffusion bonding may be carried out by pressurizing and heating without interposing the brazing material.

In this case, it is required to pressurize more uniformly than the bonding interposing the brazing material; however, the carbon layer forms a side being contact with the laminate of the spacer in the pressurizing device described in Patent Literature 1, so that displacement due to application of the load at the time of pressurizing is small, and there is a possibility that minute irregularities are generated on the surface of the laminate, or bonding failure may occur in a case in which the flatness is large since it is not pressurized uniformly.

Furthermore, if the carbon layer forms the surface in contact with the laminate in the spacer, the carbon layer is locally removed by shattering when the carbon layer is heated and pressurized with the laminate, and a part of the carbon layer may be adhered to the surface of the laminate. The foreign substances cannot be fully removed even though carrying out a soft etching treatment on the surface of a bonded body, and a problem that semiconductor elements and the like cannot be mounted on the laminate (on the circuit layer) after bonding may occur.

On the other, if strong etching treatment is carried out to remove the foreign substances, the surface of the laminate after bonding becomes rough, so the semiconductor elements and the like cannot be mounted on the circuit layer also in this case.

The present invention is achieved in consideration of the above circumstances, and is to manufacture a good bonded body by uniformly pressurizing a laminate when the laminate of a plurality of different metal plates is bonded in a pressurizing and heating state to bond and to restrain the foreign substances from adhering to the surface of the laminate. Furthermore, it is an object to manufacture an insulation circuit substrate using the manufacturing method.

Solution to Problem

A method for manufacturing a bonded body according to the present invention is a manufacturing method of a bonded body manufacturing a bonded body heating a laminate of a first plate member and a second plate member while pressurizing; the first plate member includes a first metal plate, a first pressurize member in which a first metal foil/a carbon sheet or a ceramic sheet/a graphite sheet are laminated in this order is disposed so that the first metal foil is in contact to a surface of the first plate metal plate, the first metal foil is made of a material which does not react at a contact surface between the first plate member and the first metal foil when heating, and a product of Young's modulus (GPa) and a thickness (mm) of the first metal foil is 0.6 or more and 100 or less.

Note that the Young's modulus and the thickness in the present invention are values at 25° C.

By using the first metal foil made of a material that does not react with the surface of the first metal plate of the laminate during heating, when the laminate is pressurized and heated via the first metal foil, it is possible to prevent a part of the carbon sheet or the ceramic sheet from adhering to the surface of the laminate (first metal plate).

In addition, since the first metal foil is deformed to absorb a gap caused by minute unevenness and flatness of the surface of the laminate due to the ductility thereof, a bonded body in which the entire surface is uniformly bonded by applying a uniform load to the laminate can be manufactured. Furthermore, since the soft graphite sheet is disposed on the back of the hard carbon sheet or the ceramic sheet, the followability of the first metal foil to the surface shape of the laminate can be increased, and the bondability can be improved.

By setting the product of the Young's modulus (GPa) and the thickness (mm) of the first metal foil to 0.6 or more and 100 or less, the entire surface of the laminate can be pressed by bending locally so as to follow the surface shape of the laminate at the time of pressing, so that the plate members can be bonded to each other with high accuracy.

Moreover, there is no fear that a crack occurs in the first metal foil at the time of pressurization or a part of the metal foil is peeled off and adheres to the laminate, and a high quality bonded body with less defective products can be manufactured while suppressing breakage of the carbon sheet or the ceramic sheet.

If the product of the Young's modulus (GPa) and the thickness (mm) exceeds 100, the followability of the first metal foil to the surface shape of the laminate is impaired and the bonding failure occurs. If it is less than 0.6, the metal foil is broken, and carbon or ceramic adheres to the surface of the laminate.

In the present invention, it is preferable that a second pressurize member in which a second metal foil/a carbon sheet or a ceramic sheet/a graphite sheet are laminated in this order be disposed so that the second metal foil is in contact with the surface of the second plate member, the second metal foil be made of a material which does not react at a contact surface between the second plate member and the second metal foil during heating, and a product of Young's modulus (GPa) and a thickness (mm) of the second metal foil be 0.6 or more and 100 or less.

By providing a metal foil made of a material that does not react with the surface of the laminate at the time of heating on both surfaces of the laminate, it is possible to reliably prevent a part of the carbon sheet or the ceramic sheet from adhering to the surface of the laminate.

In the present invention, one of the first plate member and the second plate member is made of copper or copper alloy, and the other is made of aluminum or aluminum alloy.

Although aluminum and copper are generally subjected to solid-phase diffusion bonding, the present invention is particularly effective in a case of bonding in a solid phase.

The present invention does not exclude liquid phase bonding using brazing material. For example, it also can be applied in a case in which the first plate member is made of a metal plate, the second plate member is made of a ceramic substrate, and these members are bonded using a brazing material.

A method for manufacturing an insulation circuit substrate of the present invention is a method for manufacturing an insulation circuit substrate using the method for manufacturing a bonded body described above; the first plate member is made of a first metal plate made of copper or copper alloy, the second plate member is made of a ceramic substrate and a second metal plate made of aluminum or aluminum alloy and bonded to one surface of the ceramic substrate, and the laminate is formed by laminating the first metal plate on the second metal plate which is bonded to the ceramic substrate, and the first metal plate and the second metal plate are solid-phase diffusion bonded in a state in which the first metal foil is in contact with the first metal plate.

A manufacturing method of an insulation circuit substrate of the present invention is a method for manufacturing an insulation circuit substrate using the method for manufacturing a bonded body described above; the first plate member is formed by laminating a first metal plate made of copper or copper alloy and an AlSiC composite member formed by impregnating a porous body of silicon carbide with a metal mainly composed of aluminum, the second plate member is made of a ceramic substrate, second metal plates bonded to both surfaces of the ceramic substrate and made of aluminum or aluminum alloy, and the first metal plate laminated on one of the second metal plates, the other of the second metal plates of the second plate member and the first metal plate of the first plate member are in contact with each other and the first plate member and the second plate member are laminated to form the laminate, and in a state in which the first metal foil of the first pressurize member is brought into contact with the AlSiC composite member and the second metal foil of the second pressurize member is brought into contact with the surface of the first metal plate of the second plate member, the first metal plate and the second metal plate, and the first metal plate and the AlSiC composite member are simultaneously solid-phase diffusion bonded.

Advantageous Effects of Invention

According to the method for manufacturing a bonded body of the present invention, it is possible to manufacture a good bonded body by uniformly pressurizing the laminate when the laminate of a plurality of different metal plate is bonded in a pressurizing and heating state to bond and to restrain the foreign substances from adhering to the surface of the laminate.

DESCRIPTION OF EMBODIMENTS

Hereinafter, embodiments of the present invention will be explained with reference to the drawings.

Figure 1:
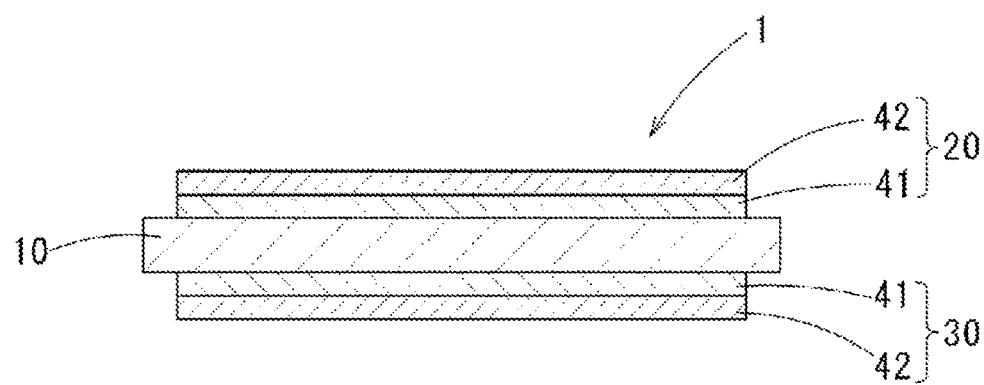
FIG. 1 It is a cross sectional view showing a power module substrate as an embodiment of a bonded body (insulation circuit substrate) of the present invention.

This embodiment is a power module substrate 1 as an example of an insulation circuit substrate (bonded body). As shown in FIG. 1, the power module substrate 1 is provided with a ceramic substrate 10, a circuit layer 20 bonded on one surface of the ceramic substrate 10, and a heat dissipation layer 30 bonded on the other surface of the ceramic substrate 10.

The ceramic substrate 10 may be, for example, nitride-based ceramic such as AlN (aluminum nitride), $Si_3N_4$ (silicon nitride), or the like, or oxide-based ceramics such as $Al_2O_3$ (alumina) or the like. A thickness of the ceramic substrate 10 is 0.2 mm or more and 1.5 mm or less.

The circuit layer 20 and the heat dissipation layer 30 have a two-layer structure of a second metal layer 41 made of aluminum or aluminum alloy and a first metal layer 42 made of copper or copper alloy. In other words, in the power module substrate 1, the second metal layer 41 is formed on both surfaces of the ceramic substrate 10, and the first metal layer 42 is formed on the second metal layer 41.

The second metal layers 41 can be pure aluminum having a purity of 99% by mass or more (for example, 1000s pure aluminum by JIS standard, particularly 1N90 (purity 99% by mass or more, so-called 3N aluminum) or 1N99 (purity 99.99% by mass or more, so-called 4N aluminum), or aluminum alloy such as A6063 system, or the like. It is preferable to use pure aluminum as the second metal layers 41 in order to buffer a difference of thermal expansion between the first metal layers 42 and the ceramic substrate 10.

The first metal layers 42 are preferably copper (oxygen-free copper) having a purity of 99.96% by mass or more and copper (tough-pitch copper) having a purity of 99.90% by mass or more.

Although the thickness of the second metal layers 41 and the first metal layers 42 is not limited, for example, the second metal layers 41 are 0.1 mm or more and 2.0 mm or less, and the first metal layers 42 are 0.2 mm or more and 5.0 mm or less. The second metal layers 41 and the first metal layers 42 having the same thickness can be used for the circuit layer 20 and the heat dissipation layer 30, or a combination of different thicknesses can be used. In the illustrated example, the circuit layer 20 and the heat dissipation layer 30 are not distinguished, and the second metal layers 41 and the first metal layers 42 are denoted by the same reference numerals.

A method of manufacturing the power module substrate 1 configured as above will be described.

Figure 2:
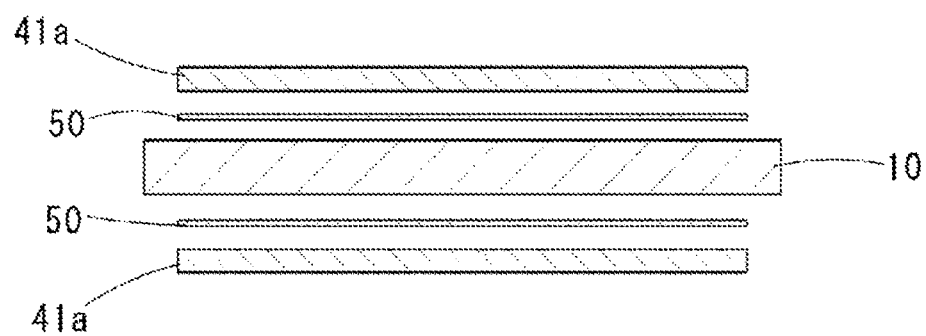
FIG. 2 It is a cross sectional view (part 1) showing a manufacturing process of the power module substrate in FIG. 1.

First, as shown in FIG. 2, second metal plates 41a made of aluminum or aluminum alloy are laminated on both surfaces of the ceramic substrate 10 via a brazing material 50, and the laminate thereof is pressurized and heated, so that the ceramic substrate 10 and the second metal plate 41a are bonded to form the second metal layers 41 on both surfaces of the ceramic substrate 10 (first bonding step).

Figure 3:
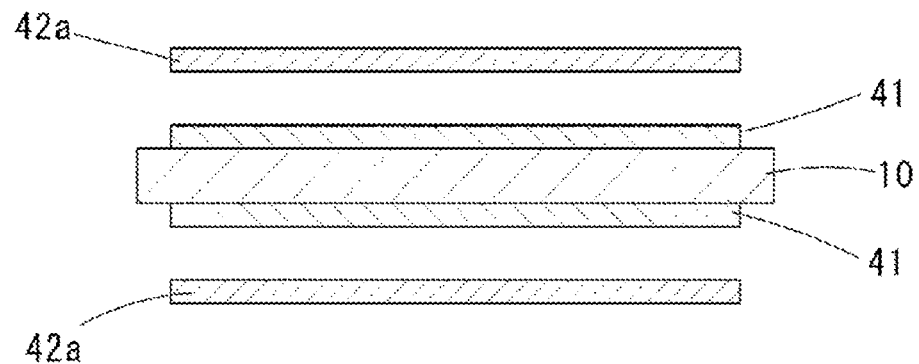
FIG. 3 It is a cross sectional view (part 2) showing the manufacturing process of the power module substrate in FIG. 1.

Next, as shown in FIG. 3, first metal plates 42a made of copper or copper alloy are laminated on the second metal layers 41, and the laminate thereof is pressurized and heated to solid-phase diffusion bond aluminum and copper, so that the first metal layers 42 are formed on the second metal layers 41 (second bonding step).

In the first bonding step, the second metal plates 41a correspond to the first plate member of the present invention and the ceramic substrate 10 corresponds to the second plate member of the present invention. On the other, in the second bonding step, the first metal plates 42a correspond to the first plate member of the present invention, and the ceramic substrate 10 and the second metal plate 41a (second metal layer 41) that is bonded on one surface of the ceramic substrate 10 correspond to the second plate member of the present invention.

Figure 4:
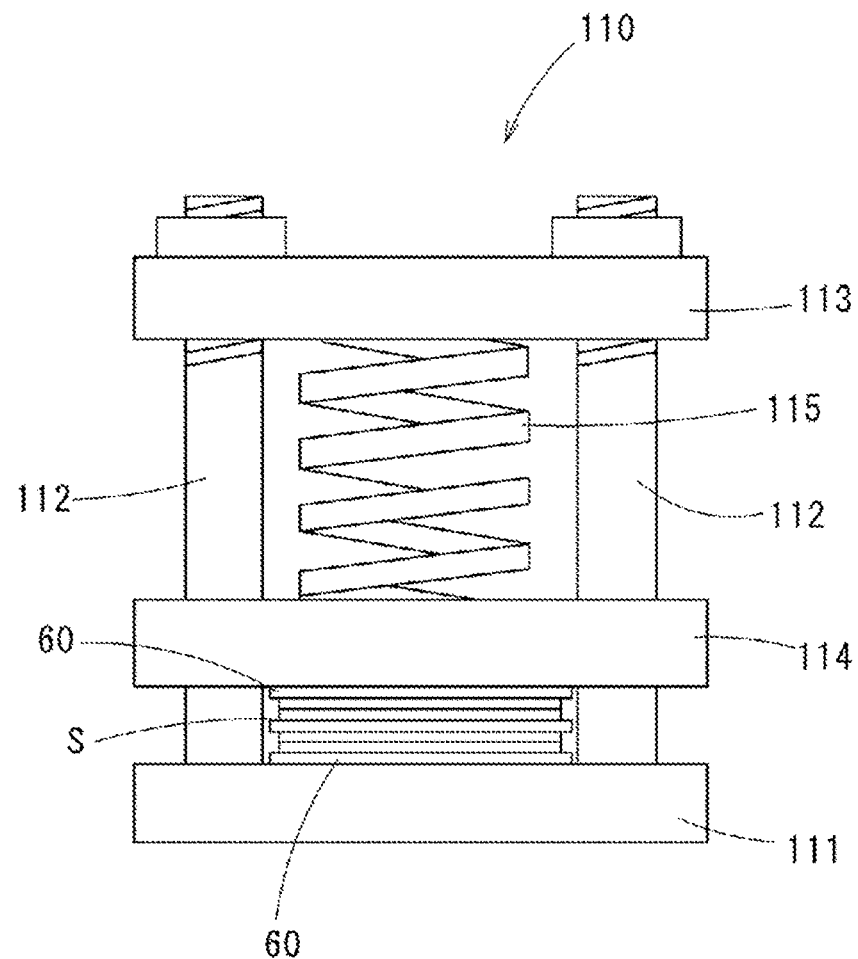
FIG. 4 It is a front view of a pressurizing device used in the manufacturing method of FIG. 2 and FIG. 3.

In this manufacturing method, a pressurizing device 110 shown in FIG. 4 is used in order to pressurize the laminate in the first bonding step and the laminate in the second bonding step. Hereinafter, the laminate (composed of the ceramic substrate 10 and the second metal plates 41a) in the first bonding step and the laminate (composed of the ceramic substrate 10 in which the second metal layers 41 are formed and the first metal plate 42a) in the second bonding step are not distinguished from each other and will be explained as the laminate S.

The pressurizing device 110 is provided with a base plate 111, guide posts 112 vertically installed on four corners on an upper surface of the base plate 111, a fixed plate 113 fixed on upper end portions of these guide posts 112, a pressurizing plate 114 held by the guide posts 112 movably up and down between the base plate 111 and the fixed plate 113, an energizing part 114 such as a spring or the like, provided between the fixed plate 113 and the pressurizing plate 114 to energize the pressurizing plate 114 downward.

The fixed plate 113 and the pressurizing plate 114 are arranged to be parallel to the base plate 111; between the base plate 111 and the pressurizing plate 114, the laminate S is arranged.

On the base plate 111 and the pressurizing plate 114, spacers 60 are arranged at a side that is in contact with the laminate S to uniform the pressure.

Figure 5:
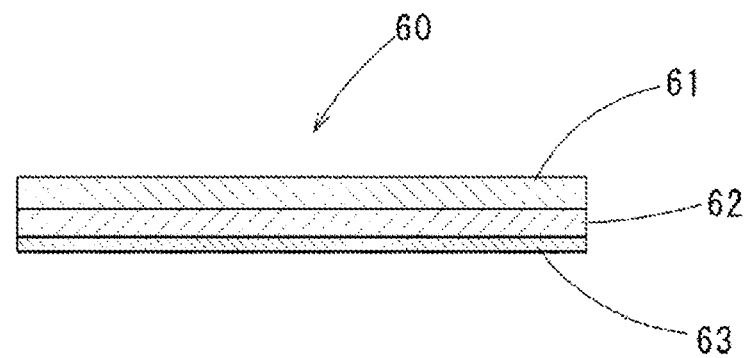
FIG. 5 It is a cross sectional view of a spacer used in the pressurizing device in FIG. 4.
Figure 6:
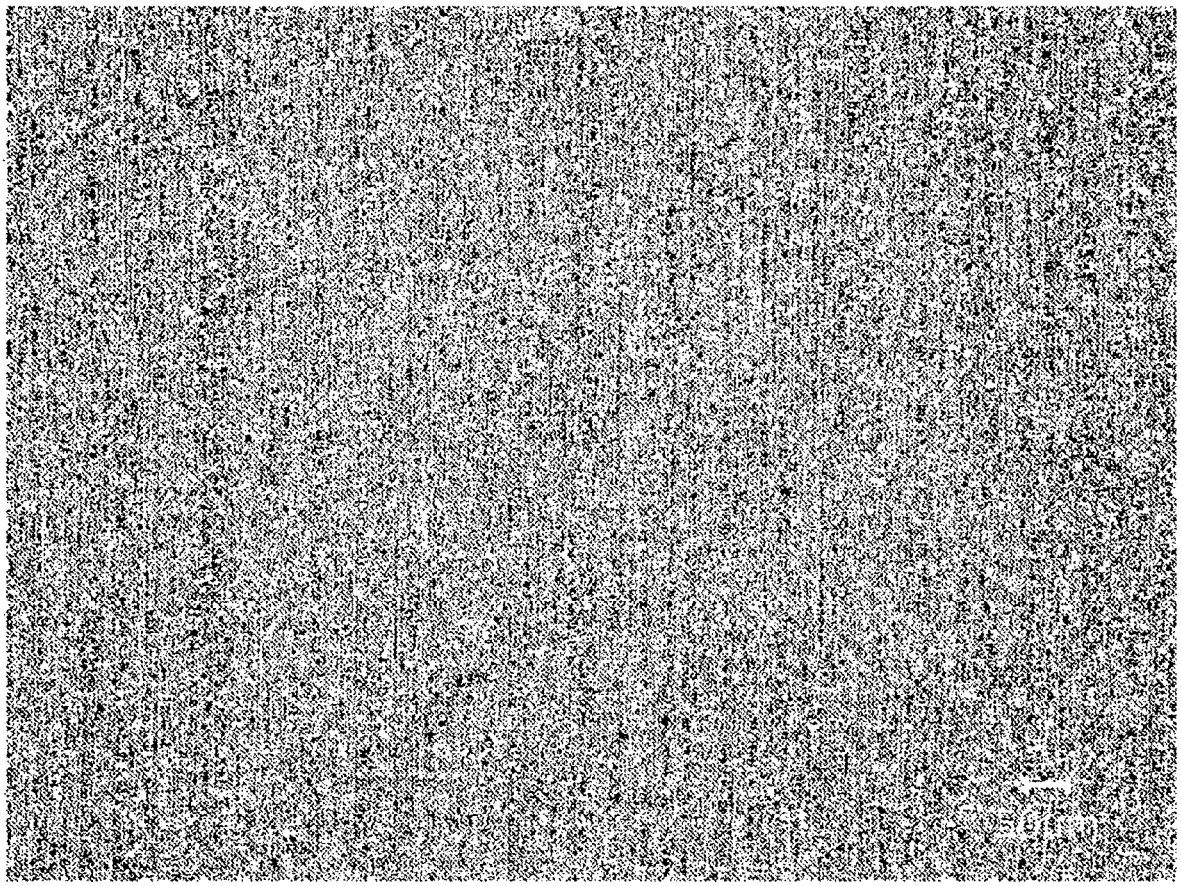
FIG. 6 It is an SEM image of a surface of a circuit layer of the sample No. 2 in the embodiment.

The spacers 60 correspond to the first pressurizing member and the second pressurizing member of the present invention, and has a structure in which a graphite sheet 61, a carbon sheet 62, and a metal foil (a first metal foil or a second metal foil) 63 are laminated in this order, as shown in FIG. 5.

The graphite sheet 61 is formed by laminating a plurality of scale-like graphite thin films like mica of a soft graphite material having a cushioning property, and is obtained by subjecting natural graphite to acid treatment and then forming into a sheet shape and roll-rolling. The graphite sheet 61 has a bulk density of 0.5 Mg/m$^3$ or more and 1.3 Mg/m$^3$ or less and soft. For example, T-5 made by Asahi Graphite Inc. (thermal conductivity 75.4 W/mK, elastic modulus 11.4 GPa), the graphite sheet PF made by Toyo Tanso Co., Ltd. (compressibility 47%, recovery rate 14%), and the like can be used.

The carbon sheet 62 is made of a hard carbon material having a heat resistance in a flat-plate shape, and is obtained by sintering in high temperature as about 3000° C. The carbon sheet 62 is formed into a relatively hard and smooth flat surface with a bulk density 1.6 Mg/m$^3$ or more and 1.9 Mg/m$^3$ or less.
For example, G-347 made by Asahi Graphite Inc. (thermal conductivity 116 W/mK, elastic modulus 10.8 GPa) can be used.

The metal foil 63 corresponds to the first metal foil and the second metal foil of the present invention, and is made of a material that does not react with the surface of the laminate S during heating. In a case in which the first metal plates 42a that are disposed on both surfaces of the laminate S are made of copper or copper alloy, it is desirable that the metal foil 63 be copper or copper alloy, or stainless. In addition, the material that does not react means a material that is not peeled off when cooled from bonding temperature to normal temperature and in which intermetallic compound between the metal foil and the surface of the laminate is not formed.

Although the thickness of the spacers 60 is not specifically limited, for example, the graphite sheet 61 is 0.5 mm or more and 5.0 mm or less, the carbon sheet 62 is 0.5 mm or more and 2.0 mm or less, and the metal foil 63 is 0.005 mm or more and 0.15 mm or less.

Appropriate metal can be selected for the metal foil if it is a material that does not react with the surface (here, copper) of the laminate S during heating as described above; it is set so that the product of the Young's modulus (GPa) and the thickness (mm) is 0.6 or more and 1.00 or less. If the product is less than 0.6, the metal foil 63 is broken, and carbon adheres to the surface of the laminate S; if it exceeds 100, the followability to the surface shape of the laminate S is impaired, and the bonding failure occurs.

In addition, the Young's modulus (GPa) and the thickness are values at normal temperature (25° C.).

Although the carbon sheet 62 is used in the present embodiment, it is not limited to this but enough if it is hard and not deformed during heating; for example, a ceramic sheet or the like may be used. The ceramic sheet is a sintered body in which various ceramics such as aluminum nitride, silicon nitride, alumina or the like is made into a sheet shape for example. Specifically, for example, it is a ceramic sintered body sheet Al2O3 made by MARUWA Co., Ltd. A thickness when the ceramic sheet is used can be 0.3 mm or more and 2.0 mm or less.

Hereinafter, the first bonding step and the second bonding step using the pressurizing device 110 will be described in order.

(First Bonding Step)

As shown in FIG. 2, the second metal plate 41*a* made of aluminum or aluminum alloy is laminated on both surface of the ceramic substrate 10 via the brazing material 50 respectively to form the laminate S. As the brazing material 50, Al—Si based, Al—Ge based, Al—Cu based, Al—Mg based, or Al—Mn based alloy is used.

The laminate S is pressurized in a laminate direction using the pressurizing device 110 shown in FIG. 4 and heated whole together with the pressurizing device 110 under vacuum environment so that the second metal plate 41*a* is bonded on the ceramic substrate 10 to form the second metal layer 41 on both surfaces of the ceramic substrate 10. In this case, since the surface of the laminate S is aluminum or aluminum alloy, an aluminum foil or an aluminum alloy foil, or a stainless foil is used for the metal foil 63.

At this time, a pressurizing force is 0.1 MPa or more and 3.4 MPa or less, a bonding temperature is 600° C. or more and 655° C. or less, and a heating time is 15 minutes or more and 120 minutes or less, for example.

(Second Bonding Step)

As shown in FIG. 3, on the second metal layer 41 formed on both surfaces of the ceramic substrate 10, the first metal plate 42*a* made of copper or copper alloy is laminated to form the laminate S.

The laminate S is pressurized in the laminate direction using the pressurizing device 110 shown in FIG. 4 and heated together with the pressurizing device 110 under vacuum atmosphere to solid-phase diffusion bond the first metal plate 42*a* to the respective second metal layers 41, so that the first metal layer 42 is formed on the respective second metal layers 41. In this case, since the surface of the laminate S is copper or copper alloy, a copper alloy or a copper alloy foil, or a stainless foil is used for the metal foil 63.

As the stainless foil, a foil material of SUS304 can be used, for example. A foil material of titanium or nickel can also be used. In this case, it is preferable to use a foil material of titanium or nickel having a purity of 99% or more.

In this case, the pressurizing force is 0.3 MPa or more and 3.5 MPa or less, and the heating temperature is 400° C. or more and 548° C. or less, for example. By maintaining the pressurizing and heating state for 5 minutes or more and 240 minutes or less, the second metal layer 41 and the first metal plate 42*a* are *soli*-phase diffusion bonded, so that the first metal layer 42 is formed on the second metal layer 41.

As described above, in the pressurizing device 110 of this embodiment, the spacers 60 are disposed between the laminate S in which the first metal plate 42 is laminated on the second metal layer 41 and the base plate 111 and the pressurizing plate 114, and the metal foils 63 are disposed on the contact surface side of the spacers 60 to the laminate S.

Since the metal foils 63 are ductile material, the metal foils are deformed to follow the surface even in a case in which the surface of the laminate is uneven or a case in which the flatness thereof is low. Moreover, since the metal foils 63 are set so that the product of the Young's modulus (GPa) and the thickness (mm) is 0.6 or more and 100 or less, the deformability is excellent as described above.

Accordingly, the uniform pressurizing force is applied on the whole surface of the laminate S and the whole surface can be evenly bonded. Furthermore, since it is not a brittle material such as the carbon sheet, it is not broken by pressurizing; and since it is a material that does not react with the first metal plate 42*a* provided on the surface of the laminate S, it is not adhered on the first metal plate 42*a*.

As described above, by using the pressurizing device 110 in which the spacers 60 are provided, it is possible to manufacture the high-quality power module substrate (insulation circuit substrate) 1 without bonding defect.

The present invention is not limited to the above-described embodiment and various modifications may be made without departing from the scope of the present invention.

For example, the manufacturing method of the present invention can be applied on a case of forming a circuit layer having a two-layer structure in which an aluminum layer and a copper layers are on one surface of the ceramic substrate; on the other surface of the ceramic substrate, and it is not necessary to have a heat dissipation layer having the two-layer structure as in the embodiment. In this case, the spacer that is in contact with the ceramic substrate 10 is not necessarily provided with the metal foil 63.

Although the surface of the laminate is made of copper or copper alloy in the above-described embodiment, it may be aluminum or aluminum alloy; in that case, it is desirable that the metal foil of the spacer be aluminum or aluminum alloy, or stainless.

The manufacturing method of the present invention may be applied not only to bonding of the metal plate made of copper or copper alloy and the metal plate made of aluminum or aluminum alloy, but also to bonding of the AlSiC composite member and copper or copper alloy.

The AlSiC composite member is a composite body of aluminum and silicon carbide that is formed by impregnating a porous body made of silicon carbide (SiC) with a metal in which a main ingredient is aluminum (Al: pure aluminum or aluminum alloy), in which a coating layer of aluminum is formed on a surface of the porous body.

Figure 8:
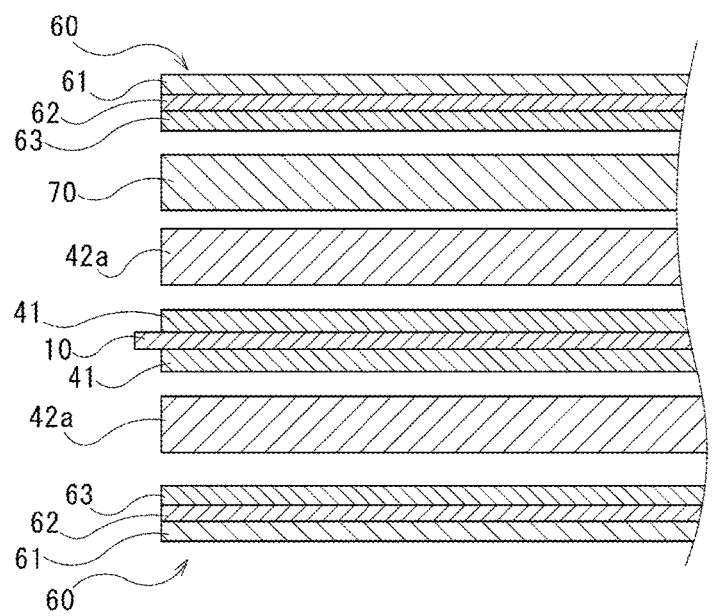
FIG. 8 It is a cross sectional view showing a manufacturing process of another power module substrate.

In a case of using this AlSiC composite material, as shown in FIG. 8, on the respective metal layers 41 formed on both surfaces of the ceramic substrate 10, the first metal plates 42*a* made of copper or copper alloy are laminated respectively and a plate-shape AlSiC composite member 70 is laminated one of the first metal plate 42*a* to form the laminate.

For this laminate, the metal foil (first metal foil) 63 of the spacer (first pressurizing member) 60 is brought into contact with a surface of the AlSiC composite member 70 and the metal foil (second metal foil) 63 of the spacer (second pressurizing member) 60 is brought into contact with the surface of the first metal plate 42*a*, and the laminate is pressurized in the laminate direction and heated in vacuum atmosphere, so that it is possible to solid-phase diffusion bond the respective second metal layers 41 and the first metal plates 42*a*, and the first metal plate 42*a* and the AlSiC composite member 70 simultaneously.

In this case, the circuit layer and the heat dissipation layer made of the first metal layer and the second metal layer are formed respectively on the ceramic substrate by the method described in the above-mentioned embodiment, and the insulation circuit substrate in which the AlSiC composite member as a heat sink is bonded to the first metal layer of the heat dissipation layer can be obtained.

That is, it is preferable that the second metal layer be formed on both surfaces of the ceramic substrate (by the first bonding step), the first metal plate be laminated on the respective second metal layers, and further, the AlSiC composite member be laminated on one of the first metal plates, and the laminate be pressurized and heated to solid-phase diffusion bond (second bonding step).

The present invention is not limited to the circuit layer and the heat dissipation layer of the power module substrate and can be applied to combinations of metals which can be bonded in a liquid phase and a solid phase, particularly it is effective for a combination of metal which can be bonded in the solid phase. Moreover, the present invention can be applied for bonding plate members (e.g., ceramic substrates) other than a metal plate and a metal plate.

EXAMPLES

Evaluation test were carried out to confirm the effectiveness of the present invention. In this test, the second metal plate made of aluminum or aluminum and the first metal plate made of copper or copper alloy were laminated to be bonded. Aluminum alloy (A6063) was used as the second metal plate, and pure copper (C1020) was used as the first metal plate. The metal plate at the side in contact with the spacer was an adherend.

The spacer was a laminated structure body of a graphite sheet, a carbon sheet or a ceramic sheet, and a metal foil. For the metal foil, any one of SUS 304 as stainless steel (SUS), C1020 as copper (Cu), and A6063 as aluminum (Al) was used. The Young's modulus and the thickness of them are shown in Table 1 (values at normal temperature (25° C.)).

A test using spacers composed of the graphite sheet (PF-100 made by Toyo Tanso Co., Ltd.) and the carbon sheet (G-347 made by Asahi Graphite Inc.), the ceramic sheet (the ceramic sintered body sheet $Al_2O_3$ made by MARUWA Co., Ltd.) was also carried out.

The laminate of the metal plates was pressurized and heated at the pressurizing force 1.0 MPa and a temperature 500° C. for a maintaining time 30 minutes to evaluate the adhesiveness, the bondability (followability), and the removal by shattering on the surface (adhesion of foreign substances).

(Evaluation of Adhesiveness of Spacer)

Regarding the adhesiveness of the spacers, it was evaluated as "A" when it was cooled to normal temperature after bonding, if the metal foil can be peeled off from the laminate by man power and intermetallic compound was not generated on the surface of the metal foil and the laminate by SEM-observing a cross section of the metal foil and the surface of the laminate; or evaluated as "B" in the other cases.

(Evaluation of Adhesiveness)

Regarding the adhesiveness, observing boundary surfaces of the metal layers and measuring the adherent area by an ultrasonic test equipment (FineSAT made by Hitachi Power Solutions Co., Ltd.) to calculate an adherent ratio from an area to be bonded (an area of the metal layer) before bonding; if the adherent ratio was 95% or more it was evaluated as "A", and if it was less than 95% it was "B".

(Evaluation of Removal by Shattering on Surface)

The spacer was removed from the adherent after bonding, and the surface of the adherent after soft etching of 2 to 3 μm was observed by SEM-EDX; if carbon component or ceramic component was not adhered on the pressurized area it was evaluated as "A", or a part of the metal foil remained on the adherent, it was "B".

For the soft etching, sodium hydroxide aqueous solution (5% by mass of concentration) was used if the adherent was Al, at 50° C. for two minutes. If the adherent was Cu, CL-8 made by ADEKA (20% by volume of dilution ratio) was used, at normal temperature (25° C.) for two minutes.

TABLE 1

| | | STRUCTURE OF SPACER | | | | | |
|---|---|---|---|---|---|---|---|
| | COMPOSITION | THICKNESS (mm) | | METAL FOIL | | | |
| SAMPLES | OF ADHERENT (FIRST METAL PLATE) | GRAPHITE SHEET | CARBON SHEET OR CERAMIC SHEET | COMPOSITION | THICKNESS (mm) | YOUNG'S MODULUS (Gpa) | YOUNG'S MODULUS × THICKNESS |
| 1 | Cu | 1.0 | Carbon/1.0 | — | — | — | — |
| 2 | Cu | 1.0 | Ceramic/0.32 | — | — | — | — |
| 3 | Cu | 1.0 | Carbon/1.0 | SUS304 | 0.003 | 197 | 0.591 |
| 4 | Cu | 1.0 | Carbon/1.0 | SUS304 | 1.00 | 197 | 197 |
| 5 | Cu | 1.0 | Carbon/1.0 | C1020 | 0.003 | 117 | 0.351 |
| 6 | Cu | 1.0 | Carbon/1.0 | C1020 | 1.00 | 117 | 117 |
| 7 | Cu | 1.0 | Carbon/1.0 | A6063 | 0.02 | 71 | 1.42 |
| 8 | Cu | 1.0 | Carbon/1.0 | SUS304 | 0.005 | 197 | 0.985 |
| 9 | Cu | 1.0 | Carbon/1.0 | SUS304 | 0.02 | 197 | 3.94 |
| 10 | Cu | 1.0 | Carbon/1.0 | SUS304 | 0.05 | 197 | 9.85 |
| 11 | Cu | 1.0 | Carbon/1.0 | SUS304 | 0.50 | 197 | 98.5 |
| 12 | Cu | 1.0 | Carbon/1.0 | C1020 | 0.02 | 117 | 2.34 |
| 13 | Cu | 1.0 | Carbon/1.0 | C1020 | 0.05 | 117 | 5.85 |
| 14 | Cu | 1.0 | Carbon/1.0 | C1020 | 0.80 | 117 | 93.6 |
| 15 | Cu | 1.0 | Carbon/1.0 | Ti | 0.02 | 106 | 2.12 |
| 16 | Cu | 1.0 | Carbon/1.0 | Ni | 0.02 | 204 | 4.08 |
| 17 | Al | 1.0 | Carbon/1.0 | A6063 | 0.02 | 71 | 1.42 |
| 18 | Al | 1.0 | Carbon/1.0 | SUS304 | 0.02 | 197 | 3.94 |
| 19 | Cu | 1.0 | Ceramic/1.0 | SUS304 | 0.02 | 197 | 3.94 |
| 20 | Al | 1.0 | Ceramic/1.0 | SUS304 | 0.02 | 197 | 3.94 |

TABLE 2

| SAMPLES | EVALUATION | | |
|---|---|---|---|
| | ADHESIVENESS OF SPACER | BONDABILITY (FOLLOW-ABILITY) | REMOVAL BY SHATTERING ON SURFACE (ADHERENT OF FOREIGN SUBSTANCES) |
| 1 | A | A | B |
| 2 | A | A | B |
| 3 | A | A | B |
| 4 | A | B | A |
| 5 | B | A | B |
| 6 | A | B | A |
| 7 | A | A | A |
| 8 | A | A | A |
| 9 | A | A | A |
| 10 | A | A | A |
| 11 | A | A | A |
| 12 | A | A | A |
| 13 | A | A | A |
| 14 | A | A | A |
| 15 | A | A | A |
| 16 | A | A | A |
| 17 | A | A | A |
| 18 | A | A | A |
| 19 | A | A | A |
| 20 | A | A | A |

Figure 7:
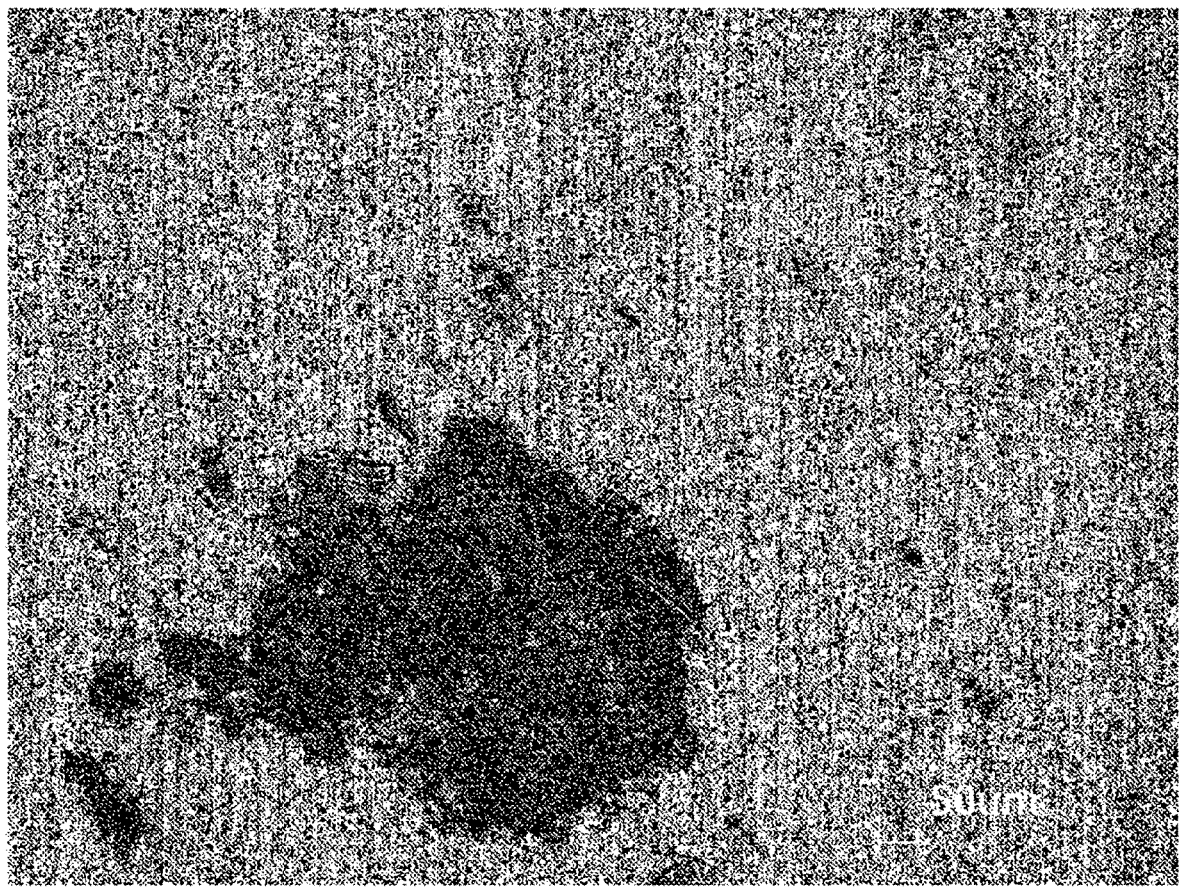
FIG. 7 It is an SEM image of a surface a circuit layer of the sample No. 1 in the embodiment.

As shown in Tables 1 and 2, it was known that in the samples Nos. 8 to 20 in which the metal foil that does not react with the adherent was used on the surface of the spacer and the product of the Young's modulus×thickness of the metal foil was 0.6 or more and 100 or less, there was no adhesion with the adherent. Specifically, from the SEM image of the sample No. 8 shown in Table 6, it is known that the foreign substances do not adhere to the surface of the adherent. On the other, in the sample No. 1, it is known from the SEM image shown in FIG. 7 that the foreign substances adhere on the surface of the adherent.

In the samples Nos. 4 and 6, since the product of the Young's modulus and thickness of the metal foil was too large, the bonding failure occurred. In the samples Nos. 3 and 5, since the product of the Young's modulus×thickness of the metal foil was too small, the metal foil was broken and the foreign substances were observed there.

In the sample No. 7, intermetallic compound was found by Cu/Al sectional SEM observation, and the bonding failure in which the spacer was adhered to the adherent occurred.

INDUSTRIAL APPLICABILITY

When a laminate of a plurality of different plate are bonded in a pressurizing and heating state, a good bonded body is manufactured by uniformly pressurizing the laminate, and foreign substances may be restrained from adhering to the surface of the laminate.

REFERENCE SIGNS LIST

1 Power module substrate (Bonded body) (Insulation circuit substrate)
10 Ceramic substrate (Second plate member)
20 Circuit layer
30 Heat dissipation layer
41 Second metal layer (Second plate member)
41a Second metal plate (First plate member/Second plate member)
42 First metal layer
42a First metal plate (First plate member)
50 Brazing material
60 Spacer (First pressurizing member and Second pressurizing member)
61 Graphite sheet
62 Carbon sheet
63 Metal foil (First metal foil and Second metal foil)
70 AlSiC composite member
110 Pressurizing device

The invention claimed is:

1. A method for manufacturing a bonded body manufacturing a bonded body heating a laminate of a first plate member and a second plate member while pressurizing, wherein
the first plate member includes a first metal plate,
a first pressurize member in which a first metal foil, a carbon sheet or a ceramic sheet, and a graphite sheet are laminated in this order is disposed so that the first metal foil is in contact to a surface of the first metal plate,
the first metal foil is made of a material which does not react at a contact surface between the first plate member and the first metal foil when heating, and
a product of Young's modulus (GPa) and a thickness (mm) of the first metal foil is 0.6 or more and 100 or less.

2. The method of manufacturing the bonded body according to claim 1, wherein
a second pressurize member in which a second metal foil/a carbon sheet or a ceramic sheet/a graphite sheet are laminated in this order is disposed so that the second metal foil is in contact with the surface of the second plate member,
the second metal foil is made of a material which does not react at a contact surface between the second plate member and the second metal foil during heating, and
a product of Young's modulus (GPa) and a thickness (mm) of the second metal foil is 0.6 or more and 100 or less.

3. The method for manufacturing the bonded body according to claim 1, wherein one of the first plate member and the second plate member is made of copper or copper alloy, and the other is made of aluminum or aluminum alloy.

4. The method for manufacturing the bonded body according to claim 2, wherein one of the first plate member and the second plate member is made of copper or copper alloy, and the other is made of aluminum or aluminum alloy.

* * * * *